(12) United States Patent
Hatani

(10) Patent No.: US 6,259,296 B1
(45) Date of Patent: Jul. 10, 2001

(54) VOLTAGE COMPARATOR

(75) Inventor: Naohisa Hatani, Kuze-gun (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/583,964

(22) Filed: May 31, 2000

(30) Foreign Application Priority Data

Jul. 12, 1999 (JP) ................................................ 11-197386

(51) Int. Cl.[7] .......................................................... H03L 5/00
(52) U.S. Cl. ................................. 327/307; 327/77; 327/91; 327/93; 327/95
(58) Field of Search ................................. 327/63, 77, 90, 327/91, 93, 94, 95, 96, 336, 337; 330/9, 51; 341/158, 159

(56) References Cited

U.S. PATENT DOCUMENTS 4,829,263 * 5/1989 Gulczyski .................................. 330/9
5,355,034 * 10/1994 Nakamura et al. ................... 327/307
6,064,239 * 5/2000 Matsuoka ............................... 327/63

* cited by examiner

*Primary Examiner*—Kenneth B. Wells
*Assistant Examiner*—Paul Dinh
(74) *Attorney, Agent, or Firm*—H. Daniel Schnurmann

(57) ABSTRACT

An analog voltage comparator for suppressing an input voltage offset is described. The voltage comparator includes: a first and a second input comparator, both operating in opposite phases, and third comparator coupled to the two input comparators. The circuit further includes a first switch connected a first capacitor coupled to a negative input of the first comparator and to the positive input of the second comparator for alternatively supplying either an input voltage Vi or a reference voltage Vref to the negative and positive input, respectively. It further includes a second capacitor between the positive input of the first comparator and the negative input of the second comparator; a second switch between the negative input and an output of the first comparator; and a third switch between the negative input and an output of the second comparator.

4 Claims, 2 Drawing Sheets

VOLTAGE COMPARATOR

FIELD OF THE INVENTION

The present invention generally relates to a voltage comparator, and more particularly to an analog voltage comparator having an input voltage offset cancel function.

BACKGROUND OF THE INVENTION

Since voltage comparators generally offset the input voltage, it is necessary to correct or eliminate this offset voltage in order to prevent an erroneous operation of the circuit.

FIG. 1 illustrates an example of a conventional comparator utilizing a single operational amplifier (to be referred to hereinafter as "Op Amp" or "OA", in short) having the aforementioned offset voltage cancel function. In the example shown, the offset voltage is corrected (i.e., eliminated) by providing a capacitor Cl between the negative input Op Amp (OA) 1 and the input select switch S1, and further by providing a feedback circuit using a switch S2 placed between the negative input and output (Vout) of OA 1.

FIG. 2 illustrates a second conventional voltage comparator circuit, wherein the comparator of FIG. 1 is now structured as a voltage comparator having two OAs operating in opposite phases to secure a rapid operation. The voltage comparator shown in FIG. 2 uses two Op Amps OA1 and OA2 operating in opposite phases, and a third one, i.e., output OA 3, connected to the two inputs OAs such that the respective outputs of the two OAs become the inputs of OA 3. A switch S1 is connected to the negative input of OA 1, while the positive input of OA 2 is coupled to capacitor C1. Switch S1 switches between input voltage Vi and a reference voltage Vref, alternatively supplying these voltages to the negative input and positive input of the OAs in question. Additionally, a feedback circuit consisting of switch S2 placed between the negative input and the positive output (Vout) of OA 1 is also provided. Moreover, a voltage Vm is supplied to the positive input of OA 1 and to the negative input of OA 2.

The example shown in FIG. 2 has a shortcoming of being unable to cancel the offset voltage of OA 2, due to the circuit configuration, since feedback is provided only to one side of OA 1. In order to avoid this limitation, it is necessary to provide OAs such that the offset between two OAs 1 and 2 becomes uniform. However, it is difficult and unrealistic to obtain a totally uniform pair of OAs using standard manufacturing semiconductor processes. Accordingly, a limitation exists in suppressing the offset voltage of the Op Amps when they depend on the manufacturing process used.

OBJECTS OF THE INVENTION

Accordingly, it is an object of the present invention to provide an analog voltage comparator capable of suppressing the input voltage offset.

It is another object to provide a comparator that achieves the primary object of the invention by way of two input operational amplifiers (OAs) operating in opposite phases.

It is still an object of the present invention to have the aforementioned circuit suppress the input voltage offset independently of the semiconductor manufacturing process used.

SUMMARY OF THE INVENTION

According to one aspect of the present invention, there is provided a voltage comparator that includes: two input operational amplifiers operating in opposing phases; and an output operational amplifier wherein outputs of the two input operational amplifiers are connected to the inputs of the output operational amplifier, the circuit being characterized by having an input voltage offset suppression circuit placed between opposite phase inputs of the two input operational amplifiers and inputs of the output operational amplifier.

The input voltage offset cancel circuit of the present invention is characterized by including a capacitor placed between opposite phase inputs of the two input operational amplifiers, and a switch between the positive input of the output operational amplifier and the capacitor.

In another aspect of the invention, there is provided a voltage comparator that includes: a first comparator and a second comparator operating in opposite phases; a third comparator coupled to the two input comparators; a first switch coupled to the negative input of the first comparator and to the positive input of the second comparator by way of a first capacitor, alternating between an input voltage and a reference voltage and supplying these voltages to a negative input and to a positive input the two input comparators; a second capacitor placed between the positive input of the first comparator and the negative input of the second comparator; a second switch positioned between the negative input and the output of the first comparator; and, finally, a third switch placed between the negative input and the output of the second comparator.

BRIEF DESCRIPTION OF THE DRAWINGS

These and other objects, aspects and advantages of the invention will be better understood by a detailed description of a preferred embodiment of the invention when taken in conjunction with the accompanying drawings, in which.

PREFERRED EMBODIMENT OF THE INVENTION

Figure 1:
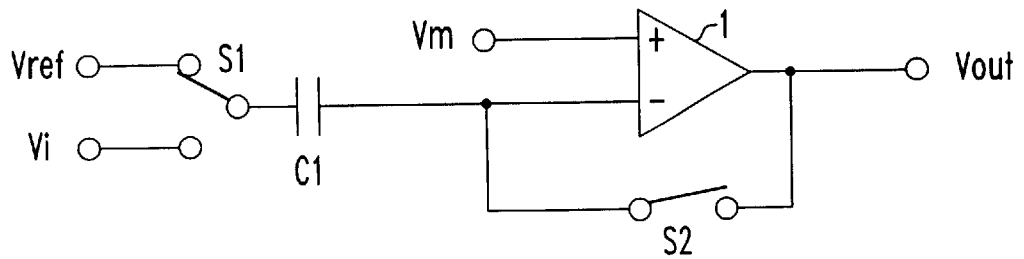
FIG. 1 shows a prior art voltage comparator using a single conventional OA.
Figure 2:
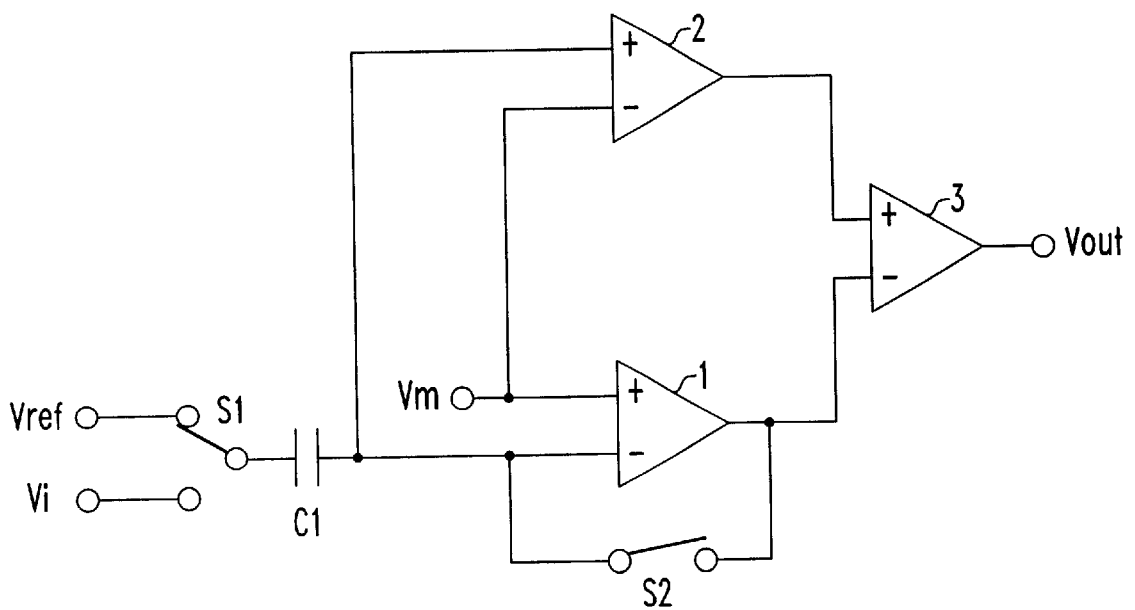
FIG. 2 shows an example of a prior art voltage comparator having two OAs operating in opposite phases.
Figure 3:
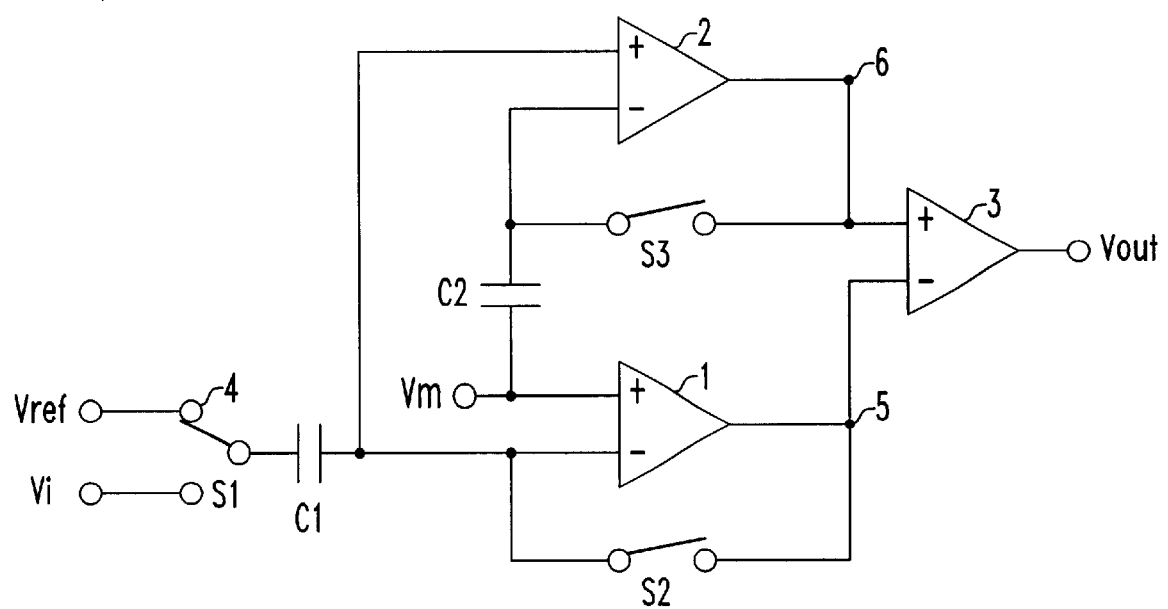
FIG. 3 shows a voltage comparator having two OAs operating in opposite phases, according to the present invention.

Referring now to FIG. 3 illustrating an embodiment of the voltage comparator according to the present invention, the two input of OA 1 and OA 2 operating in opposite phases. Furthermore, they have their respective outputs connected to the inputs of a third OA 3 (also referred to as output OA). A switch S1 connected to a capacitor C1 is coupled to the negative input of OA 1 and to the positive input of OA 2. The switch S1 alternatively provides either an input voltage Vi or a reference voltage Vref to the negative input of OA 1 and to the positive input of OA 2. Additionally, a switch S2 is connected between the negative input and the output Vout of OA 1. Thus far, the configuration described above is the same as that of the conventional comparator in FIG. 2.

The new configuration of the voltage comparator of the present invention shown in FIG. 3 is as follows. A capacitor C2 is placed between the positive input of OA 1 and the negative input of OA 2. A voltage Vm is directly supplied to the positive input of OA 1 and is also supplied to the negative input of OA 2 via a capacitor C2. Further, a feedback path consisting of switch S3 is provided between the negative input of OA 2 and the output (i.e., the positive input of OA 3), in the same manner as the feedback path described for OA 1.

The voltage comparator of the present invention in FIG. 3 is characterized in that:

(1) a rapid operation is achieved by two OAs 1 and 2 operating in opposite phases and
(2) a simultaneous cancellation of the input offset voltage of both OAs 1 and 2 is provided by capacitors C1 and C2.

The voltage comparator of the present invention of FIG. 3 may be formed on semiconductor substrates of silicon and the like, using standard semiconductor processes, which preclude the need of guarantying an identical electrical performance by the input Op Amps, as explained previously.

The operation of the voltage comparator of the present invention in FIG. 3 will now be described.

Initially, switch S1 connecting terminal 4 of capacitor C1 to reference voltage Vref, simultaneously turns on switches S2 and S3. When switch S2 turns on, a short circuit between output 5 of OA 1 and the negative phase input occurs. Accordingly, OA 1 acts as a voltage follower. The voltage V5 at the output labeled 5 of OA 1 is the sum of input voltage Vm and input offset voltage Vos1 of OA 1. Thus, $$V5=Vm+Vos1.$$

OA 2 also operates as a voltage follower, in the same manner as OA 1. The voltage V6 of the output labeled 6 of OA 2 is the sum of the output voltage V5 of OA 1 and input offset voltage Vos2 of the OA 2. Thus, $$V6=V5+Vos2=Vm+Vos1+Vos2.$$

Then, capacitors C1 and C2 are charged corresponding to the voltage difference loaded on them. That is, the capacitor C1 is charged to $$Q1=C1*(Vm+Vos1-Vref).$$

and capacitor C2 to $$Q2=C2*(Vos1+Vos2).$$

Thus, switches S2 and S3 are turned off (open). Capacitors C1 and C2 maintain the amounts of charge Q1 and Q2. Switch S1 is turned on to connect terminal labeled 4 of capacitor C1 to the input voltage Vi. The amount of charge Q1 held in capacitor C1 remains unchanged. Voltage V7 at the input terminal 7 of OA 1 changes only by (Vi−Vref). That is, $$V7=Vm+Vos1+(Vi-Vref).$$

Defining the gain of OA 1 as Ad1, the output voltage V5 of the OA 1 becomes $$Vm+Vos1-Ad1*(Vi-Vref).$$

The voltage V7 is supplied to the positive input of OA 2. Defining the gain of OA 2 as Ad2, the output voltage V6 of OA 2 becomes $$V6=Vm+Vos1+Vos2+Ad1*(Vi-Vref)$$

due to change in the voltage V7 of (Vi−Vref).
At this time, the output voltage Vout of OA 3 is $$Vout=V6-V5=Vos2+(Ad1+Ad2)*(Vi-Vref).$$

The condition for output Vout=High which occurs when V6>V5. Thus $$Vos2+(Ad1+Ad2)*(Vi-Vref)>0,$$

or $$(Vi-Vref)>(-Vos2)/(Ad1+Ad2).$$

Since the gains Ad1 and Ad2 of the Op. Amps. are usually very large, $$(-Vos2)/(Ad1+Ad2)\cong 0.$$

As a result, $$(Vi-Vref)>0$$

will be the condition for output Vout=High. Thus, when Vi>Vref, output Vout=High, and the influence of input offset voltage is canceled.

Similarly, the condition for output Vout=Low, namely V6<V5, is $$Vos2+(Ad1+Ad2)*(Vi-Vref)<0,$$

or $$(Vi-Vref)<(-Vos2)/(Ad1+Ad2).$$

Again, since the gains Ad1 and Ad2 of OAs are usually very large, $$(-Vos2)/(Ad1+Ad2)\cong 0.$$

As a result $$(Vi-Vref)<0$$

will be the condition for output Vout=Low. That is, when Vi<Vref, output Vout=Low, and the input offset voltage is likewise cancelled as in the previous case.

As explained previously, when a comparator has an input offset voltage Vos, the voltage comparator of the present invention cancels input offset voltage Vos. In contrast, in conventional comparators that are influenced by an input offset voltage Vos, the voltage Vout=High when $$(Vi-Vref)>Vos,$$

or

Vi>Vref+Vos, and Vout=Low when $$(Vi-Vref)<Vos,$$

or

Vi<Vref+Vos.

In summary, the voltage comparator according to the present invention cancels the input offset voltage due to the new circuit configuration. Further, the input offset voltage is cancelled without requiring any dependence on the manufacturing semiconductor processes, and simultaneously achieve a rapid comparison of voltages.

Whereas the present has been described in terms of a preferred embodiment, those skilled in the art will fully realize that changes and modifications to the circuit described can be made without departing form the scope and the spirit of the invention.

What is claimed is:

1. A voltage comparator comprising:

two input operational amplifiers operating in opposite phases;

an output operational amplifier having two inputs respectively connected to outputs of said two input operational amplifiers; and circuit means for suppressing an input voltage offset, the circuit means being connected to inputs of said two input operational amplifiers having opposite phases and coupled to said output operational amplifier.

2. The voltage comparator according to claim 1, wherein said input voltage offset suppressing circuit further comprises:

a capacitor coupling inputs of said operational amplifiers having opposite phases; and a switch coupling an input of said output operational amplifier and said capacitor.

3. The voltage comparator according to claim 2, wherein said input of said output operational amplifier is in a positive phase.

4. A voltage comparator for eliminating an input voltage offset, comprising:

a first comparator and a second comparator operating in opposite phases;

a third comparator coupled to said first comparator and said second comparator;

a first switch connected to a first capacitor, said capacitor connected to an input of said first comparator being in a negative state, and to an input of said second comparator being in a positive state, for alternatively supplying an input voltage and a reference voltage to said inputs in said negative state and said positive state;

a second capacitor coupled to said input of the first comparator being in said positive state and to said input of said second comparator being in said negative state;

a second switch connected to said input in said negative state and to said output of said first comparator; and a third switch connected to said input in said negative state and to said output of said output of the second comparator.

* * * * *